US009189953B2

(12) United States Patent
Smith

(10) Patent No.: US 9,189,953 B2
(45) Date of Patent: Nov. 17, 2015

(54) RF DYNAMIC POWER CONTROL AND RADIO PROTECTION IN METERING DEVICES

(71) Applicant: Itron, Inc., Liberty Lake, WA (US)

(72) Inventor: Thomas Benjamin Smith, Landrum, SC (US)

(73) Assignee: Itron, Inc., Liberty Lake, WA (US)

( * ) Notice: Subject to any disclaimer, the term of this patent is extended or adjusted under 35 U.S.C. 154(b) by 216 days.

(21) Appl. No.: 13/717,333

(22) Filed: Dec. 17, 2012

(65) Prior Publication Data

US 2014/0167975 A1    Jun. 19, 2014

(51) Int. Cl.
| | |
|---|---|
| G01R 27/06 | (2006.01) |
| G08C 19/00 | (2006.01) |
| H04W 52/24 | (2009.01) |
| H04B 17/10 | (2015.01) |
| H04B 1/04 | (2006.01) |
| H04B 17/00 | (2015.01) |

(52) U.S. Cl.
CPC ............... *G08C 19/00* (2013.01); *G01R 27/06* (2013.01); *H04B 17/103* (2015.01); *H04W 52/242* (2013.01); *H04B 1/0458* (2013.01); *H04B 1/0466* (2013.01); *H04B 17/0035* (2013.01)

(58) Field of Classification Search
CPC .... G01R 27/06; H04B 1/0458; H04B 1/0466; H04B 17/0035; H04B 2001/0416; H04B 2001/045
USPC ............. 340/870.02; 333/17.3; 324/534, 646, 324/645, 642; 455/115.1, 127.1
See application file for complete search history.

(56) References Cited

U.S. PATENT DOCUMENTS

| | | | | |
|---|---|---|---|---|
| 4,267,599 | A * | 5/1981 | Vissers | 455/115.1 |
| 7,127,220 | B2 * | 10/2006 | Abrams et al. | 455/127.5 |
| 7,977,919 | B1 * | 7/2011 | Jaoude et al. | 320/136 |
| 2003/0076168 | A1 | 4/2003 | Forrester | |
| 2008/0026710 | A1 * | 1/2008 | Buckley | 455/127.5 |
| 2011/0086600 | A1 | 4/2011 | Muhammad | |
| 2012/0249165 | A1 * | 10/2012 | Mcerlean et al. | 324/642 |
| 2012/0293383 | A1 * | 11/2012 | Randall et al. | 343/720 |
| 2012/0293900 | A1 | 11/2012 | Kim et al. | |
| 2014/0057684 | A1 * | 2/2014 | Khlat | 455/574 |

FOREIGN PATENT DOCUMENTS

EP        1503504      2/2005

OTHER PUBLICATIONS

PCT Search Report and Written Opinion mailed Feb. 26, 2014 for PCT Application # PCT/US13/62740.

\* cited by examiner

*Primary Examiner* — Dennis Joseph
*Assistant Examiner* — Benyam Haile
(74) *Attorney, Agent, or Firm* — Lee & Hayes, PLLC

(57) ABSTRACT

Techniques for dynamic power control of a radio of a utility data collection device (e.g., utility meter configured for wireless communications) are described that utilize a detection scheme applied to a Front End Module (FEM) in the utility data collection device. A utility data collection device measures a Voltage Standing Wave Ratio (VSWR) presented to the FEM during transmission. The result of this measurement allows the utility data collection device to dynamically control the input power to a FEM transmit portion. Utilizing these techniques, the utility data collection device can adjust to environmental changes and conditions experienced in the field.

17 Claims, 4 Drawing Sheets

RF DYNAMIC POWER CONTROL AND RADIO PROTECTION IN METERING DEVICES

BACKGROUND

Utility service providers employ numerous radio frequency (RF) utility meters, smart meters, sensors, and/or control devices (collectively "utility data collection devices") as part of advanced metering infrastructures (AMIs) and/or automated meter reading (AMR) environments. These utility data collection devices are generally equipped with front-end modules (FEMs) that facilitate one- or two-way RF wireless communications.

To facilitate wireless communications, a utility data collection device has one or more antennas that interface to the FEM, such that each antenna is "impedance matched" to the FEM to minimize mismatch loss. Regarding transmission from a power amplifier, mismatch loss in transmission line theory is the amount of power generally expressed in decibels (dB) that will not be available on the output (e.g., a transmit antenna) due to impedance mismatches and signal reflections. A FEM that is properly terminated with the same impedance as that of the characteristic impedance of the antenna will have no reflections and therefore no mismatch loss.

In a factory setting, antennas are substantially impedance matched to their corresponding FEMs. However, after utility data collection devices are deployed in the field, numerous external influences can result is impedance mismatches between the FEM and the antenna of a utility data collection device. As an example, a utility data collection device may be located in a "non-friendly" RF enclosure, such as inside an all metal enclosure, covered with metal foil (e.g., intentional or unintentional tampering by a user), or the like. These externally induced impedance mismatches can give rise to reflections of a transmitted signal that may be strong enough to damage a power amplifier of an FEM, or cause a transmitted signal to become non-linear, degrading the signal-to-noise ratio (SNR) of a transmitted signal and increasing the difficulty of a receiver to receive the transmitted signal. Thus, these externally induced impedance mismatches can damage the FEM of a utility data collection device and/or degrade the signal transmitted by the utility data collection device.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Figure 1:
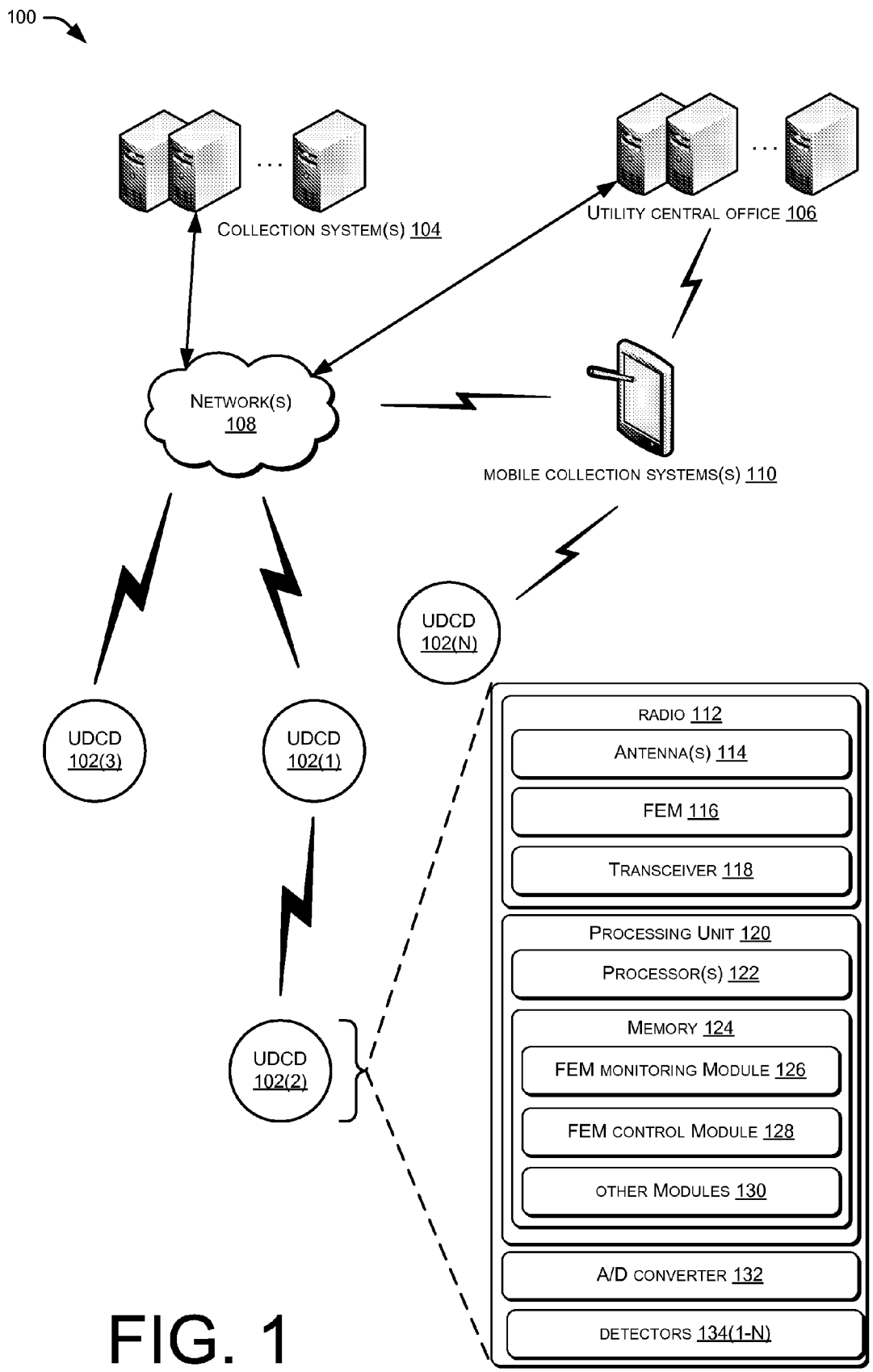
FIG. 1 is a diagram showing an example environment of utility data collection devices.

A utility meter, smart meter, sensor, and/or control device (collectively "utility data collection device" (UDCD)) that is, for example, part of an advanced metering infrastructure (AMI) and/or an automated meter reading (AMR) environment, generally contains a front-end module (FEM) used to transmit and receive radio frequency (RF) signals via one or more antennas. A transmit portion of the FEM should ideally be linear, such that the gain of the transmit amplifier/antenna combination is essentially constant for any combination of input and output signal. A linear system will respond at that same frequency with a certain magnitude and a certain phase angle of an output signal relative to an applied input signal. If the system is not linear, the output signal will be distorted. When a transmit antenna connected to a transmit interface of a FEM of a utility data collection device is subjected to externally (or internally) induced factors that cause an impedance mismatch between the transmit interface of the FEM and the antenna, the transmitted signal becomes distorted. A portion of the transmitted power is generally reflected back to the transmit amplifier, which can damage or destroy the transmit amplifier, or distort the transmitted signal.

This application describes techniques for dynamic power control of a radio of a utility data collection device by introducing a detection scheme using the FEM. In an embodiment, both the forward travelling wave and the reflected wave are accurately measured by a processing unit of the utility data collection device to determine a Voltage Standing Wave Ratio (VSWR) presented to the FEM during transmission. The result of this measurement allows the utility data collection device to dynamically control the input power to a FEM transmit portion. As an example, the input power to the FEM transmit portion is controlled to compensate for antenna load conditions, such as externally (or internally) induced factors that may have caused an impedance mismatch between an antenna and the FEM.

In an embodiment, a processing unit of a utility data collection device measures the forward traveling wave in the FEM by utilizing a directional coupler in the FEM to couple some of the forward traveling wave to a power detector that provides an output voltage proportional to the transmitter's output power. The reflected wave is also measured in the FEM by utilizing a directional coupler to couple some of the reflected traveling wave to a power detector that provides an output voltage proportional to the reflected power. The output of the two separate detectors is then sampled by an analog-to-digital (A/D) converter, and compared to determine a true VSWR measurement. As a result, the processing unit dynamically adjusts the transmitter output power to simultaneously provide a more linear output along with protecting the transmitter from incurring damage due to a bad load (e.g., impedance mismatch) at the antenna.

This application also describes techniques for calibrating a power level transmitted by the FEM using a switch located inside the FEM. In an embodiment, a processing unit of a utility data collection device will direct a switch (e.g., double-pole-double-throw (DPDT) switch) to switch a transmit signal in the FEM to a calibrated known load so that detectors of the processing unit are accurately calibrated in both manufacturing and in the field as an on-the-fly check. As an example, in manufacturing, the detected outputs are calibrated and a lookup table is used to provide appropriate power settings relative to detected power. As another example, the processing unit can activate the switch to apply a known load to verify specific power settings and adjust the calibration of the detectors in the field as a means to account for various environmental changes to which the utility data collection device may be subjected. In an embodiment, the processing unit of a utility data collection device uses a lookup table that is tailored to characteristics of the FEM transmitter to dynamically control the transmit power level of the FEM transmitter.

This application also describes techniques for protection of a transmitter of the FEM that involve monitoring a current of the FEM transmitter. In an embodiment, a current monitor inside the FEM toggles a voltage output that provides the processing unit of the utility data collection device with a way of detecting if an over-current condition has occurred in the FEM transmitter. The processing unit can then shut the FEM transmitter down and proceed through a series of steps to determine the cause of the over-current condition.

The utility data collection devices described herein may operate in the example context of a wireless utility network (e.g., mesh, star, mobile/handheld, etc.) including a plurality of utility data collection devices, such as utility meters that measure, store and transmit utility consumption data. Utility data collection devices may include, for example, low-power digital radios, smart utility meters (e.g., electric, gas, and/or water meters), sensors (e.g., temperature sensors, weather stations, frequency sensors, etc.), control devices, transformers, relays, switches, valves, and other network devices. As such, these utility data collection devices may be part of low power and lossy networks (LLNs), and operate using protocols (e.g., ZigBee, IEEE 802.15.4 and its variants, or the like) suitable for low-rate wireless personal area networks (WPANs), home area networks (HANs), neighborhood area networks (NANs), or the like. As such, in other implementations, a utility data collection device may include any device coupled to a communication network and capable of sending and/or receiving data. In an embodiment, a utility data collection device is a device (e.g., utility meter) that directly collects or concentrates utility consumption data (e.g., consumption of gas, water, electricity), and is configured to wirelessly transmit that data to one or more receiving entities.

Example implementations and embodiments are described below. In a first section, an "Example Architecture" discusses an example environment of utility data collection devices. A second section, "Example Utility Data Collection Device," discusses various examples of a utility data collection device. A further section, "Example Methods of Utility Data Collection Device Operation," discusses example methods of operation of a utility data collection device. Finally, the application concludes with a brief "Conclusion." This Overview and the following sections, including the section headings, are merely illustrative implementations and embodiments and should not be construed to limit the scope of the claims.

Example Architecture

FIG. 1 is a schematic diagram of example architecture 100 of a utility data collection environment. The architecture 100 includes a plurality of utility data collection devices (UDCDs) 102(1)-102(N) (collectively referred to as utility data collection devices or UDCDs 102) communicatively coupled to one or more of collection systems 104, utility central office 106, or to each other via direct communication paths or "links." Network 108 represents one or more wired or wireless networks used to facilitate communications between at least a subset of utility data collection devices, collection system(s) 104 and the utility central office 106. One or more of collection system(s) 104 may be collocated with utility central office 106 and one or more of collection system(s) 104 may be distributed throughout environment 100 in wired or wireless communication with utility central office 106 via network 108. In one example, utility data collection devices 102 may be part of a low power and lossy network (LLN). As an example, network 108 has one or more wireless nodes (not shown) for communicating with wireless devices, such as utility data collection devices 102. One or more collection system(s) 104 and/or the utility central office 106 may include wireless interfaces for communicating with wireless devices, such as utility data collection devices 102.

As an example, utility data collection device 102(1) provides collected utility data wirelessly to a collection system 104. Collection system 104 may process collection data received from one or more of utility data collection device 102, and provide the processed utility data to the utility central office 106 for validation, storage, analytics, or other purposes. As illustrated in FIG. 1, utility data collection device 102(1) has a wireless "link" to utility data collection device 102(2), such that utility data collection device 102(1) may receive data collected by utility data collection device 102(2), and pass that data upstream to the collection system(s) 104 and/or the central office 106.

Utility data collection device 102(3) is shown in FIG. 1 as having a wireless link to network 108 for wirelessly providing collected utility data to collection system(s) 104 and/or utility central office 106. Utility data collection devices 102(1)-102(3) represent any number of utility data collection devices that are part of an advanced metering infrastructure (AMI).

Utility data collection device 102(N) is shown in FIG. 1 as having a wireless link to one of various types of mobile collection system(s) 110. Utility data collection device 102(N) is configured to wirelessly transmit collected utility data to mobile collection system(s) 110. As an example, utility data collection device 102(N) represents one of any number of utility data collection devices that are part of an automated metering (AMR) environment. Mobile collection system(s) 110 may be configured to collect utility data, process the collected utility data, wirelessly communicate collected utility data to networks 108, wirelessly communicate collected utility data to utility central office 106, or manually provide collected utility data to collection system(s) 104 and/or utility central office 106 as one or more data files.

Utility data collection device 102(2) is representative of utility data collection devices 102 and includes a radio 112. Radio 112 includes one or more antennas 114, a front-end module 116 for transmitting and receiving RF signals, a transceiver 118 to transceive RF signals associated with one or more RF communication technologies (e.g., frequency shift keying (FSK), offset quadrature phase shift keying (OQPSK), orthogonal frequency-division multiplexing (OFDM), code division multiple access (CDMA), etc.) associated with one or more communication protocols (e.g., ZigBee, IEEE 802.15.4 and its variants, etc.), power line communications and at least one processing unit 120.

Front-end module 116 may include one or more transmit amplifiers (e.g., power amplifier, transmit amplifier stages, etc.), receive amplifiers (e.g., low-noise amplifier (LNA)), switches (e.g., double-pole-double-throw (DPDT) switch), couplers (e.g., directional coupler) and control logic. Front-end module 116 may also include one or more antenna interfaces configured to be impedance matched with antenna(s) 114 to minimize mismatch loss. As an example, a transmitter interface of front-end module 116 is configured to have essentially the same characteristic impedance as an interface of transmit antenna 114, to minimize, or essentially eliminate, reflection of power transmitted by front-end module 116. When a transmit antenna 114 and a transmitter interface of front-end module 116 do not have matching impedances, some of the electrical energy cannot be transferred from the transmit amplifier of front-end module 116 to transmit antenna 114. Energy not transferred through antenna 114 may be reflected back towards the transmit amplifier of front-end module 116. It is the interaction of these reflected waves with forward waves which causes standing wave patterns. Reflected power has three main implications in radio transmitters: Radio Frequency (RF) energy losses increase, distortion occurs at the transmitter due to reflected power from the mismatched antenna load and damage to the transmitter can occur.

Processing unit 120 includes one or more processors 122 communicatively coupled to memory 124. Memory 124 stores one or more software or firmware modules, which are executable on or by the one or more processors 122 to implement various functionality. While the modules are described herein as being software or firmware executable on a processor, in other embodiments, any or all of the modules may be implemented in whole or in part by hardware (e.g., as an application specific integrated circuit (ASIC), a gate array, a specialized processing unit, etc.).

In the embodiment of FIG. 1, memory 124 includes a FEM monitoring module 126 to monitor FEM 116, an FEM control module 128 for controlling FEM 116, and various other modules 130 to facilitate the collection, management, processing and distribution of collected utility data, as well as other functions required for operation of a utility data collection device 102. In the embodiment of FIG. 1, utility data collection device 102 includes one or more analog-to-digital (A/D) converters 132 to facilitate conversion of analog signals, such as analog signals detected from FEM 116, into digital signals for processing by processing unit 120. Utility data collection device 102 may also include one or more digital-to-analog (D/A) converters (not shown) to convert, for example, digital signals from processing unit 120 into analog signals for FEM 116. In the embodiment of FIG. 1, utility data collection device 102 also includes detectors 134(1-N). As an example, detectors 134(1-N) may include power detectors that convert detected power to voltage signals associated with the detected power.

Memory 124 is an example of computer-readable media and may take the form of volatile memory, such as random access memory (RAM) and/or non-volatile memory, such as read only memory (ROM) or flash RAM. Computer-readable media includes volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. As defined herein, computer-readable media does not include communication media, such as modulated data signals and carrier waves.

Example Utility Data Collection Device

Figure 2:
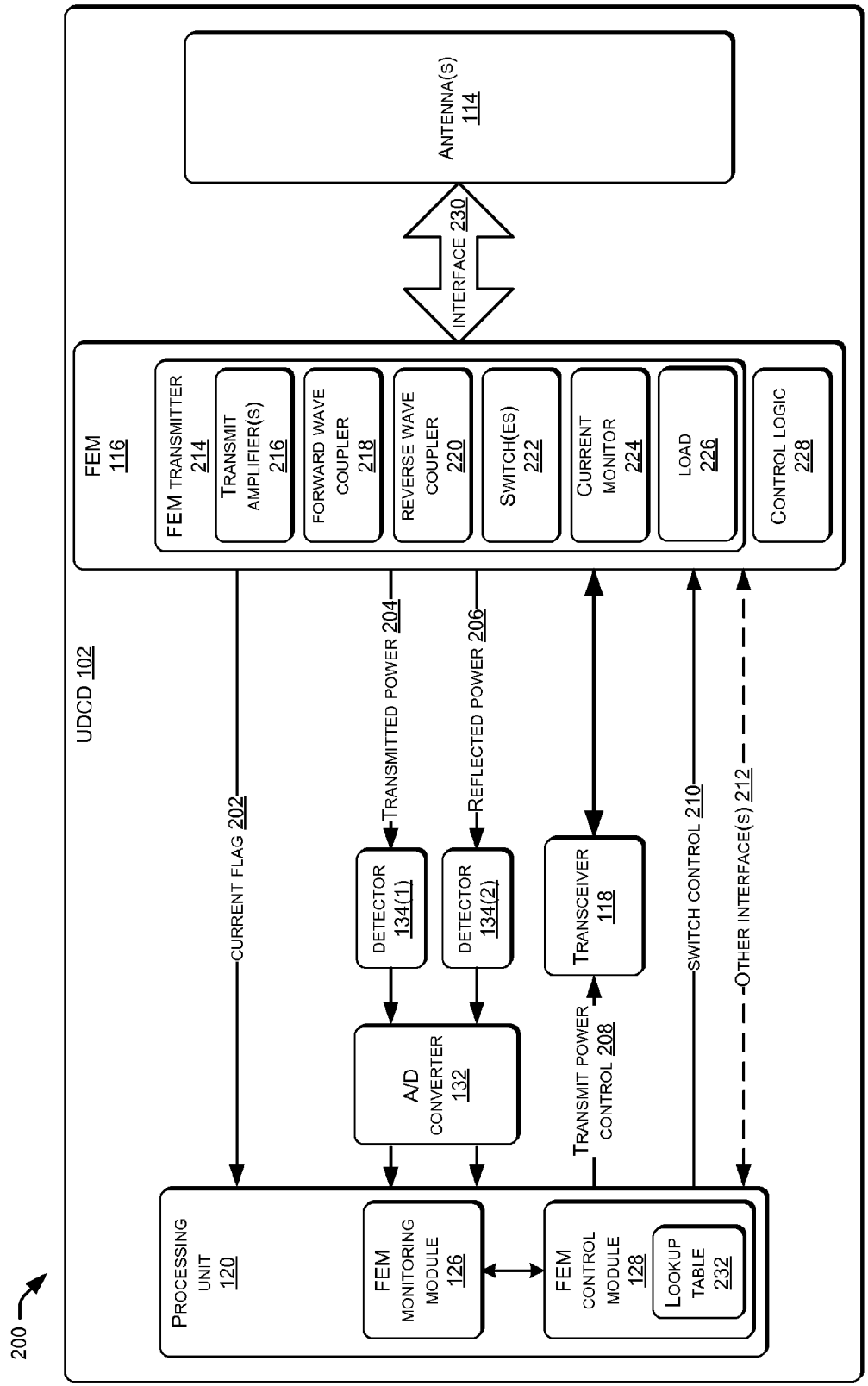
FIG. 2 is a schematic diagram showing additional detail of a utility data collection device from FIG. 1.

FIG. 2 is a schematic diagram of example environment 200 showing an example of a utility data collection device 102 of FIG. 1. Numerous other configurations of utility data collection devices are possible, thus FIG. 2 illustrates but one example environment of an example utility data collection device 102. Furthermore, example environment 200 focuses on embodiments of transmitter monitoring and control, associated with a transmitter portion of FEM 116 and a transmit antenna 114. However, other embodiments are also possible.

FIG. 2 illustrates various exemplary interfaces (e.g., connections, connection points, etc.) between processing unit 120 and FEM 116 including current flag 202, transmitted power 204, reflected power 206, transmit power control 208, switch control 210, and/or other interfaces 212. In various embodiments, other interfaces 212 may provide for communication of analog and/or digital signals between processing unit 120 and FEM 116, and may contain one or more A/D and/or D/A converters (not shown). As an example, other interface(s) 212 provides for control of components of FEM 116 by processing unit 120, detection of signals (e.g., measurements) from FEM 116 by processing unit 120 and/or communications between FEM 116 and processing unit 120.

FIG. 2 shows FEM 116 further including FEM transmitter 214 for transmitting RF signals from transceiver 118. By way of example, FEM transmitter 214 may include, but is not limited to, transmit amplifier(s) 216 (e.g., power amplifier, transmit amplifier stages, etc.) for transmitting signals containing data, such as utility consumption data, a forward wave coupler 218 for obtaining measurements accessible at interface transmitted power 204 associated with a transmitted power level in FEM 214, a reverse wave coupler 220 for obtaining measurements accessible at interface reflected power 206 associated with a reflected power level in FEM 214, one or more switches 222 for switching signals being transmitted within FEM transmitter 214 to different transmission paths, a current monitor 224 to drive interface current flag 202, a load 226 (e.g., a calibration load) and control logic 228 to facilitate and control various operations of FEM 116. Load 226 is shown within FEM transmitter 214 in the example embodiment of FIG. 2. However, in other embodiments, load 226 may be external to FEM transmitter 214 as well as external to FEM 116 within UDCD 102, or may be omitted entirely. In an embodiment, load 226 is connected to a switch 222, such that processing unit 120, via switch control 210, can instruct switch 222 to switch a transmit path between interface 230 and load 226. As an example, processing unit 120 instructs switch 222 to switch a transmission path to load 226 for calibration purposes. In an embodiment, processing unit 120 receives a signal (e.g., wireless signal) to instruct switch 222 to switch a transmission path to load 226. As an example, processing unit 120 may be configured to report measurements of transmitted and reflected power when the transmission path is connected to antenna 114 and/or load 226 to a reporting entity (e.g., utility central office 106.) Such measurements may allow a reporting entity to detect a potential impedance mismatch between antenna 114 and FEM 116, or other related issues. In another embodiment, processing unit 120 may determine to control switch 222 to compare measurements of transmitted and reflected power when the transmission path is connected to antenna 114 and load 226. Processing unit 120 may report results of the comparison to a reporting entity, for example, when there are differences between transmitted and reflected power between antenna 114 and load 226 above a threshold.

FIG. 2 shows FEM 116 interfacing with antenna(s) 114 via interface 230. Interface 230 may include any interface between FEM 116 and antenna(s) 114, such as a connector (e.g., coax connector, direct connection), a filter, an impedance matching network, and/or the like. As an example, in manufacturing UDCD 102, interface 230 includes a substantially impedance matched connection between FEM 116 and antenna(s) 114. Interface 230 may include multiple interfaces for multiple antenna(s) 114, one or more unused interfaces, multiple interfaces for a single antenna 114 or a single interface for a single antenna 114.

For purposes of simplicity, FIG. 2 shows A/D converter 132 as a single A/D converter that receives a signal from detector 134(1) associated with a measurement level on interface transmitted power 204 and a signal from detector 134(2) associated with a measurement level on interface reflected power 206. However, as an example, A/D converter 132 may include multiple A/D converters, such as, one for each of detectors 134(1) and 134(2). As another example, detectors 134(1) and 134(2) may each include an A/D converter 132. As another example, processing unit 120 may control a switch (not shown) that selects when one of detectors 134(1) and 134(2) are directed to A/D converter 132. Other configurations are within the scope of the disclosure. In various embodiments, A/D converter 132 is configured to receive an analog signal from detector 134(1) associated with a measurement level on interface transmitted power 204 and receive an analog signal from detector 134(2) associated with a measurement level on interface reflected power 206, convert these analog signals to digital signals, and provide the digital signals to processing unit 120 for processing by FEM monitoring module 126. Based at least in part on the processing performed by FEM monitoring module 126, in an embodiment, FEM monitoring module 126 is configured to work in conjunction with FEM control module 128 to adjust a power level transmitted by transceiver 118 to FEM transmitter 214 via interface transmit power control 208. In an alternate embodiment, FEM control module 128 may direct FEM 116 to adjust a power level transmitted by FEM transmitter 214, such as, via other interface(s) 212. Additionally, in an embodiment, FEM control module 128 may be configured to control one or more of switch(es) 222 in FEM transmitter 214 via interface switch control 210.

FEM monitoring module 126 may also be configured to receive a signal from FEM 116 via interface current flag 202, and work in conjunction with FEM control module 128 to adjust a power level transmitted by transceiver 118 to FEM transmitter 212 via interface transmit power control 208, adjust a power level transmitted by FEM transmitter 214 via other interface(s) 212 and/or control one or more of switch(es) 220 in FEM transmitter 212 via switch control 202. In an embodiment, FEM 116 is configured to provide a signal on interface current flag 202 that indicates an over-current condition in FEM transmitter 214, such that processing unit 120 takes action to shut down transceiver 118 and/or FEM transmitter 214.

As described herein, processing unit 120 implements a dynamic power control of power transmitted in radio 112 by using a detection scheme with FEM 116. As an example, processing unit 120 accurately measures both the forward travelling wave and the reflected wave in a transmission path of FEM transmitter 214 during transmission to determine the Voltage Standing Wave Ratio (VSWR) presented to FEM 116.

In an embodiment, forward wave coupler 218 measures at least a portion of the forward travelling wave (e.g., a signal transmitted by one or more of transmit amplifiers 216), and provides the measurement of the forward travelling wave to power detector 134(1) via transmitted power 204 connection. Then, detector 134(1) provides an output voltage proportional to the transmitted power to A/D converter 132 which provides a digital conversion of the output voltage to processing unit 120. In an embodiment, forward wave coupler 218 is a connection in the transmit path of FEM transmitter 214, such as a connection between amplifier stages of transmit amplifiers 216. As such, a measurement of the forward travelling wave may be substantially isolated from influence by the reflected wave via isolation provided by a downstream amplifier stage in a cascade of transmit amplifier stages. In an alternate embodiment, forward wave coupler 218 is a directional coupler in the transmit path of FEM transmitter 214 such that forward wave coupler 218 couples at least a portion of the forward traveling wave provided to detector 134(1) via connection transmitted power 204.

Reverse wave coupler 220 measures at least a portion of a reflected wave (e.g., a reflected portion of the forward traveling wave) in the transmit path of FEM transmitter 214 (e.g., measured at a last amplifier stage of a cascade of transmit amplifiers 216), and provides the measurement of the reflected wave to power detector 134(2) via reflected power 206 connection. Then, detector 134(2) provides an output voltage proportional to the reflected power to A/D converter 132 which provides a digital conversion of the output voltage proportional to the reflected power to processing unit 120. In an embodiment, reverse wave coupler 220 is a directional coupler in the transmit path of FEM transmitter 214 that couples at least a portion of the reflected wave provided to detector 134(2) via connection reflected power 206.

In an embodiment, FEM monitoring module 126 compares the measurements of the transmitted power and the reflected power (e.g., A/D converted voltages from detectors 134(1) and 134(2), respectively), to determine a true VSWR measurement. Knowing the VSWR measurement allows FEM control module 128 to dynamically control a transmit power level of FEM transmitter 214. In an embodiment, FEM control module 128 uses lookup table 232 stored in memory 124 to dynamically control a transmit power level of FEM transmitter 214. As an example, lookup table 232 associates VSWR measurements and/or measurements of the transmitted power and the reflected power with appropriate transmit power levels of FEM transmitter 214. As another example, lookup table 232 contains predetermined thresholds (e.g., thresholds for VSWR, transmitted power and/or reflected power) indicating whether FEM control module 128 should increase a transmitted power level, decrease a transmitted power level, or maintain a current transmitted power level. As another example, lookup table 232 contains a plurality of associations between VSWR measurements, measurements of transmitted power and/or measurements of reflected power associated with various appropriate transmit power levels for FEM transmitter 214.

As an example, after UDCD 102 is deployed to the field, externally (or internally) induced factors may cause an impedance mismatch between FEM 116 and antenna(s) 114. FEM monitoring module 126 may detect this change in antenna load as an increased VSWR measurement, such that FEM control module 128 may incrementally lower the transmitted power until FEM monitoring module 126 determines that the VSWR measurement is within an acceptable range. FEM monitoring module 126 may use lookup table 232 to facilitate the determination that the VSWR measurement is within an acceptable range. As another example, FEM monitoring module 126 may detect the change in antenna load due to the externally (or internally) induced factors as an increased VSWR measurement, such that FEM control module 128 adjusts the transmitted power to a level as indicated in lookup table 232.

Thus, FEM monitoring module 126 and FEM control module 128 work in conjunction to dynamically adjust the transmitter output power to simultaneously provide a more linear transmitted signal, along with protecting the transmitter (i.e., FEM transmitter 214) from incurring damage due to a bad load (e.g., impedance mismatch) at antenna 114. In an embodiment, based on environmental or other changes that require altered power level settings, processing unit 120 may adjust lookup table 232 with one or more updated associations and/or values that reflect the altered power level settings.

For example, a VSWR measurement of 1.2:1 denotes a maximum standing wave amplitude that is 1.2 times greater than the minimum standing wave value. A VSWR measurement of 1:1 indicates, for example, that the characteristic impedance of FEM 116 at interface 230 matches the characteristic impedance of antenna 114, such that substantially no reflected power is measured at detector 134(2). High levels of reflected power can distort, damage or destroy components of FEM transmitter 214. Some FEM transmitters are designed to withstand relatively large levels of reflected power (e.g., VSWR=8:1) without damage and/or high levels of reflected power within a VSWR stability and load mismatch susceptibility level (e.g., VSWR=4:1). These design constraints increase the cost of FEM transmitters. Thus, the techniques described herein allow for dynamically adjusting the transmitter output power to simultaneously provide a more linear output along with protecting the transmitter from incurring damage due to a bad load (e.g., impedance mismatch) at the antenna, such that the transmitter is not required to endure high levels of reflected power, thereby reducing the cost of the FEM transmitter.

In another embodiment, processing unit 120 is configured to control switch 222 in FEM 116 to switch to known calibration load 226 to facilitate calibration of radio 112 in manufacturing, or on the fly after UDCD 102 has been installed in the field. As an example, processing unit 120 instructs switch 222, via interface switch control 210, to switch the transmit path of FEM transmitter 214 from, for example, interface 230, to load 226. Since load 226 is a known calibration load, detectors 134(1) and 134(2) can be calibrated. In manufacturing, the detected outputs (i.e., outputs of detectors 134(1) and 134(2)) are calibrated such that lookup table 232 provides power settings relative to detected output values of detected power. In the field, processing unit 120 dynamically adjusts power levels up and/or down to verify specific power settings and adjusts the calibration of detectors 134(1) and 134(2) as a means to account for environmental changes. In an embodiment, load 226 includes multiple known loads, and processing unit 120 is configured to select any of the known loads of load 226 as part of a calibration process. In an embodiment, switch 222 is a double-pole-double-throw (DPDT) switch.

In yet another embodiment, processing unit 120 is configured to monitor interface current flag 202 from FEM 116 to facilitate an additional protection of FEM transmitter 214. As an example, a current monitor inside FEM 116 will toggle a voltage output on current flag 202 to notify processing unit 120 if an over-current condition has occurred. In the event that an over-current condition has occurred, processing unit 120 can then shut down FEM transmitter 214 and proceed through a series of steps to determine the cause of the over-current condition. In an embodiment, if an over-voltage condition is indicated on current flag 202, FEM control module 128 is configured to instruct transceiver 118 to stop transmitting to FEM 116 by sending transceiver 118 a shut-down command or signal via transmit power control 208. In another embodiment, FEM control module 128 is configured to send a shut-down command or signal to FEM 116 via other interfaces 212.

Example Methods of Utility Data Collection Device Operation

Figure 3:
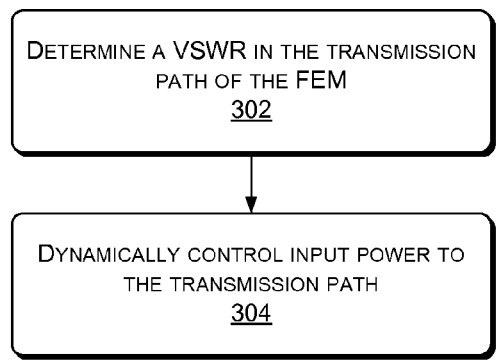
FIG. 3 is a flowchart illustrating an example method of implementing a detection scheme using a front end module (FEM) of a utility data collection device.

FIG. 3 illustrates an example method 300 of implementing a detection scheme to a FEM. The method 300 is described with reference to the example architecture 200 of FIG. 2 for convenience. However, the method 300 is not limited to use with the example architecture 200 of FIG. 2 and may be implemented using other architectures and devices.

At operation 302, a UDCD determines a VSWR in a transmission path of a front end module (FEM) in the UDCD. As an example, processing unit 120 compares a transmitted power level and a reflected power level provided by detectors 134(1) and 134(2), respectively, to determine the VSWR. Detector 134(1) is a transmitted power detector that is interfaced to forward wave coupler 218 in FEM 116 and detector 134(2) is a reflected power detector that is interfaced to reverse wave coupler 220 in FEM 116. At operation 304, processing unit 120 dynamically controls an input power to the transmission path of the FEM based at least in part on the measured VSWR. As an example, processing unit 120 controls the power output level of transceiver 118 over interface transmit power control 208 to adjust the input power level presented to FEM transmitter 214.

In operation, processing unit 120 may detect a current flag signal via interface current flag 202 indicating an over-current condition. Processing unit 120 may then direct transceiver 118 to stop transmitting in the transmission path, and then take steps to determine a cause of the over-current condition.

In manufacturing or in the field, processing unit 120 may direct switch 222 to switch the transmission path to known calibrated load 226, determine a VSWR in the transmission path associated with the known calibrated load and calibrate detectors 134(1) and 134(2) based at least in part on the determined VSWR in the transmission path associated with the known calibrated load. Processing unit 120 may use lookup table 232 for dynamically controlling the input power to the transmission path of FEM transmitter 214 based at least in part on the measured VSWR.

Figure 4:
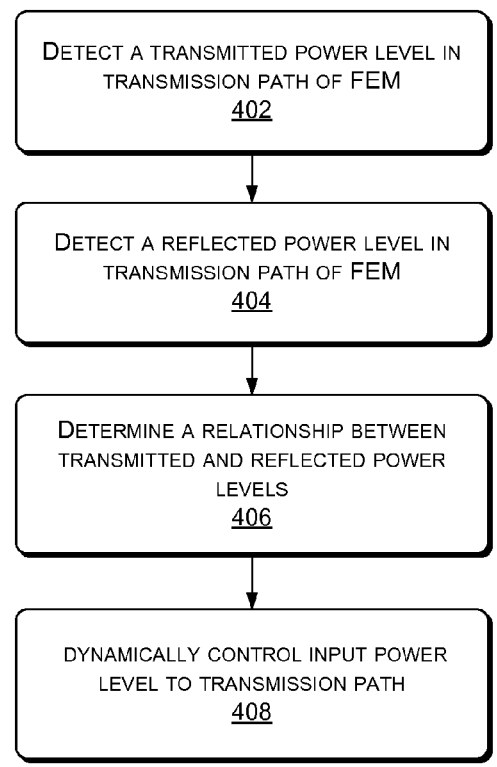
FIG. 4 is a flowchart illustrating another example method of implementing a detection scheme using a FEM of a utility data collection device.

FIG. 4 illustrates an example method 400 of implementing a detection scheme to a FEM. The method 400 is described with reference to the example architecture 200 of FIG. 2 for convenience. However, the method 400 is not limited to use with the example architecture 200 of FIG. 2 and may be implemented using other architectures and devices.

At operation 402, processing unit 120 detects a measurement indicating a transmitted power level in a transmission path of FEM transmitter 214 from detector 134(1) via A/D converter 132. At operation 404, processing unit 120 detects a measurement indicating a reflected power level in the transmission path of FEM transmitter 214 from detector 134(2) via A/D converter 132. At operation 406, processing unit 120 determines a relationship between the measurement indicating a transmitted power level and the measurement indicating a reflected power level. At operation 408, processing unit 120 dynamically controls an input power level to the transmission path based at least in part on the determined relationship.

CONCLUSION

Although the application describes embodiments having specific structural features and/or methodological acts, it is to be understood that the claims are not necessarily limited to the specific features or acts described. Rather, the specific features and acts are merely illustrative some embodiments that fall within the scope of the claims of the application.

What is claimed is:

1. A method implemented by a utility data collection device (UDCD), the method comprising:
    determining, by the UDCD, a first standing wave ratio in a transmission path of a front end module (FEM) in the UDCD;

adjusting a lookup table to include power level settings in response to installation of a metal covering over the UDCD;
switching the transmission path to a known calibrated load, selected from among multiple known loads, in the FEM;
determining a second standing wave ratio in the transmission path associated with the known calibrated load;
calibrating a transmitted-power detector and a reflected-power detector in the UDCD based at least in part on the determined second standing wave ratio; and
controlling an input power to the transmission path of the FEM based at least in part on the first and second standing wave ratios, the calibrated transmitted-power detector and the calibrated reflected-power detector and based at least in part on power level settings provided by the adjusted lookup table.

2. The method of claim 1, wherein the UDCD comprises a utility meter that measures and transmits utility consumption data.

3. The method of claim 1, wherein determining the first standing wave ratio is based at least in part on:
detecting, from the transmitted power detector in the UDCD, a measurement indicating a transmitted power level in the transmission path of the FEM;
detecting, from the reflected power detector in the UDCD, a measurement indicating a reflected power level in the transmission path of the FEM; and
comparing the measurement indicating the transmitted power level and the measurement indicating the reflected power level.

4. The method of claim 3, wherein:
the transmitted power detector is interfaced to a forward wave coupler in the FEM; and
the reflected power detector is interfaced to a reverse wave coupler in the FEM.

5. The method of claim 4, wherein:
the forward wave coupler includes a connection to the transmission path in the FEM or a directional coupler; and
the reverse wave coupler includes a directional coupler.

6. The method of claim 1, further comprising:
detecting a signal from the FEM indicating an over-current condition;
stopping transmission in the transmission path based at least in part on detecting the signal from the FEM; and
determining a cause of the over-current condition.

7. The method of claim 1, wherein the UDCD uses the lookup table for the controlling the input power to the transmission path of the FEM based at least in part on the first standing wave ratio, wherein the first standing wave ratio is a voltage standing wave ratio (VSWR).

8. The method of claim 1, wherein the calibrating is configured to account for environmental changes.

9. A utility data collection device (UDCD), the UDCD comprising:
a front end module (FEM) configured to implement a transmission path to transmit a wireless signal;
a transmitted power detector configured to use a forward wave coupler in the FEM to provide a measure of transmitted power in the transmission path;
a reflected power detector configured to use a reverse wave coupler in the FEM to provide a measure of reflected power in the transmission path;
a processing unit configured to:
adjust a lookup table to include power level settings in response to installation of a metal covering over the UDCD;
determine a relationship between the measure of transmitted power and the measure of reflected power;
control a level of power transmitted in the transmission path based at least in part on the relationship between the measure of transmitted power and the measure of reflected power;
direct the FEM to switch the transmission path to a known calibrated load in the FEM;
determine a voltage standing wave ratio (VSWR) in the transmission path associated with the known calibrated load;
calibrate the transmitted power detector and the reflected power detector based at least in part on the determined VSWR in the transmission path associated with the known calibrated load;
determine that the relationship indicates a distortion of the wireless signal in the transmission path; and
adjust the level of power transmitted in the transmission path to reduce the distortion, wherein the adjusting is performed at least in part according to the adjusted lookup table.

10. The device of claim 9, wherein:
the forward wave coupler includes a directional coupler; and
the reverse wave coupler includes a directional coupler.

11. The device of claim 9, wherein the processing unit is configured to:
determine that the relationship indicates that the measure of reflected power in the transmission path is above a predetermined threshold; and
adjust the level of power transmitted in the transmission path to reduce the measure of reflected power in the transmission path to below the predetermined threshold.

12. The device of claim 9, wherein the UDCD includes a utility meter that measures and transmits utility consumption data.

13. The device of claim 9, wherein the processing unit is configured to:
detect a signal from the FEM indicating an over-current condition;
stop transmission in the transmission path responsive to detecting the signal from the FEM; and
determine a cause of the over-current condition.

14. A processing unit in a utility data collection device (UDCD), the processing unit configured to perform acts comprising:
detecting, from a transmitted power detector in the UDCD, a measurement indicating a transmitted power level in a transmission path of a front end module (FEM);
detecting, from a reflected power detector in the UDCD, a measurement indicating a reflected power level in the transmission path of the FEM;
adjusting a lookup table to include power level settings in response to installation of a metal cover that blocks radio transmission from the UDCD;
determining a relationship between the measurement indicating the transmitted power level and the measurement indicating the reflected power level;
controlling an input power level to the transmission path based at least in part on the relationship;
directing the FEM to switch the transmission path to a known calibrated load in the FEM;
determining a voltage standing wave ratio (VSWR) in the transmission path associated with a known calibrated load;

calibrating the transmitted power detector and the reflected power detector based at least in part on the determined VSWR in the transmission path associated with the known calibrated load;

determining whether the relationship indicates a distortion in the transmission path; and when the relationship is determined to indicate distortion in the transmission path, adjusting the input power level to reduce the distortion, wherein the adjusting is based at least in part on the adjusted lookup table.

15. The processing unit of claim 14, wherein:

the UDCD includes a utility meter that measures and transmits utility consumption data;

the transmitted power detector is interfaced to a forward wave coupler in the FEM; and the reflected power detector is interfaced to a reverse wave coupler in the FEM.

16. The processing unit of claim 14, the acts further comprising:

switching the transmission path between the known calibrated load in the FEM and an antenna.

17. The processing unit of claim 14, the acts further comprising:

detecting a signal from the FEM indicating an over-current condition;

stopping transmission in the transmission path responsive to detecting the signal from the FEM; and determining a cause of the over-current condition.

* * * * *